United States Patent [19]

Yazawa

[11] Patent Number: 4,493,095
[45] Date of Patent: Jan. 8, 1985

[54] COUNTER HAVING A PLURALITY OF CASCADED FLIP-FLOPS

[75] Inventor: Akira Yazawa, Tokyo, Japan

[73] Assignee: Nippon Electric Co., Ltd., Tokyo, Japan

[21] Appl. No.: 378,356

[22] Filed: May 14, 1982

[30] Foreign Application Priority Data

May 14, 1981 [JP] Japan .................................. 56-72503

[51] Int. Cl.³ ...................... H03K 21/32; H03K 21/34
[52] U.S. Cl. ..................................... 377/107; 377/114; 377/115
[58] Field of Search ................. 377/47, 114, 115, 116, 377/107

[56] References Cited

U.S. PATENT DOCUMENTS 3,631,350 12/1971 Drake ................................. 377/116

Primary Examiner—John S. Heyman
Attorney, Agent, or Firm—Sughrue, Mion, Zinn, Macpeak, and Seas

[57] ABSTRACT

An improved counter wherein consecutively cascaded flip-flops of the prior art are divided into two groups. A first detector produces a first signal in response to a predetermined set of flip-flop states of the first group. A second detector produces a second signal in response to a predetermined set of flip-flop states of the second group. A third detector produces a count output in response to simultaneous existence of the first and second signals. The output from the first group is arranged in phase so that the second signal may be produced before the count output is produced, by applying an inverted output of the first group to the input of the second group.

17 Claims, 7 Drawing Figures

FIG. I
(PRIOR ART)
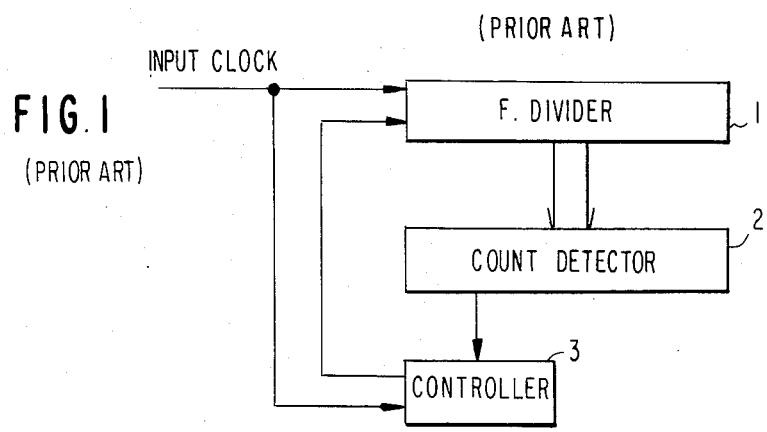
FIG. 2
(PRIOR ART)
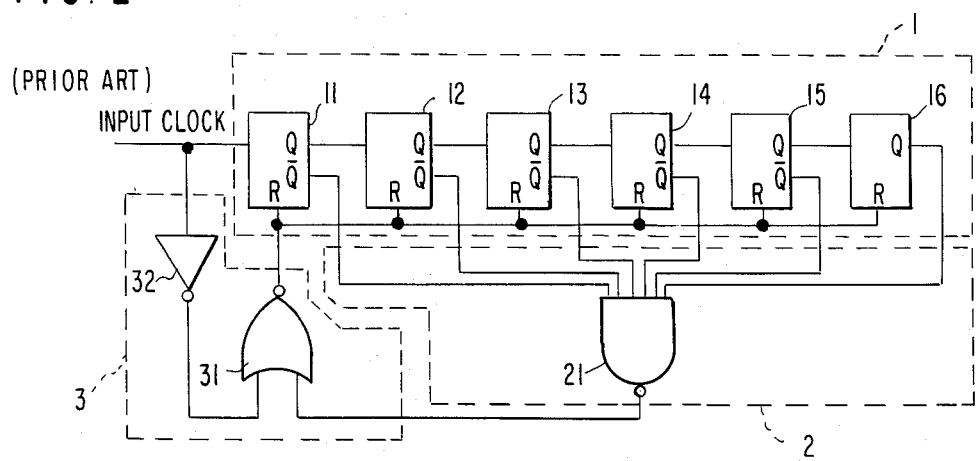
FIG. 3
(PRIOR ART)
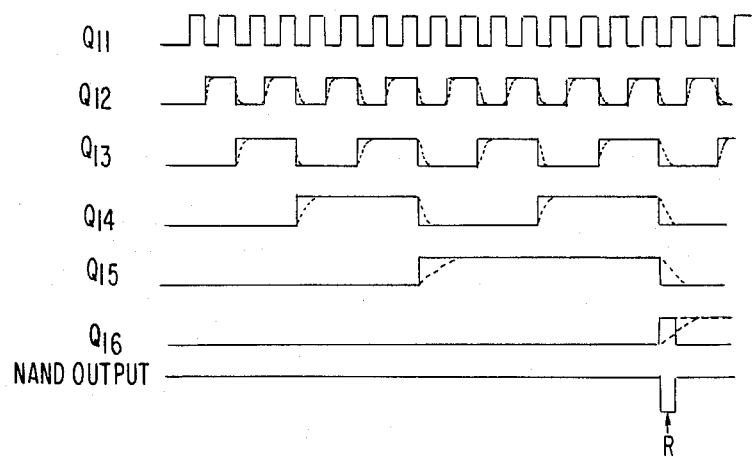

COUNTER HAVING A PLURALITY OF CASCADED FLIP-FLOPS

BACKGROUND OF THE INVENTION

1. Field of the Invention

This invention relates to a counter using a frequency-divider in which a plurality of flip-flops are cascaded.

2. Description of the Prior Art

The conventional counter has a frequency-divider 1, a count detector 2 and a controller 3, as shown in FIG. 1. A clock signal to be counted is applied to the frequency-divider 1, having a series of flip-flops for counting the clock signal. A predetermined set of flip-flop states is detected by the count detector 2. The count detector 2 is composed of, for example, a NAND gate having a plurality of inputs each connected to the desired outputs of the flip-flops. The output from the count detector 2 is applied to the controller 3 to reset the flip-flops in the frequency-divider 1 in synchronism with the clock signal. The counter output is derived from the input or output of the controller 3.

A concrete example of the conventional counter is shown in FIG. 2. The frequency-divider 1 is composed of six flip-flops 11 to 16 so that an output Q of each flip-flop is applied to the succeeding flip-flop. The clock signal is applied to the first stage flip-flop 11. The count detector 2 includes a NAND gate 21 having six inputs, each connected to the output Q or the inverted output $\bar{Q}$ of the respective flip-flops 11 to 16. The selection of the output Q or the inverted output $\bar{Q}$ is selected from the binary form of the number to be counted. In order to detect, for example, "32", the respective inputs of the NAND gate 21 are connected to the inverted outputs $\bar{Q}$ of the flip-flops 11 to 15 and the output Q of the flip-flop 16. The controller 3 has a 2-input NOR gate 31 and an inverter 32. The output of the count detector 2, that is, the output of the NAND gate 21, is connected to one input of the 2-input NOR gate 31. To the other input of the 2-input NOR gate 31 is applied the inverted clock signal. The output of the 2-input NOR gate 21 is applied to the reset terminals R of the flip-flops 11 to 16. Due to the application of the inverted clock signal to the 2-input NOR gate 21, the reset of the flip-flops 11 to 16 is synchronized with the clock signal.

The output signals $Q_{11}$ to $Q_{16}$ obtained at the corresponding output terminals of the flip-flops 11 and the output of the NAND gate 21 are illustrated in FIG. 3. In the illustration the NAND gate 21 produces an output at a time when the outputs $Q_{11}$ to $Q_{15}$ are at a low level while the output $Q_{16}$ is at a high level. When this output occurs, the flip-flops 11 to 16 are reset to an initial state.

The above operation represents an ideal condition where no time delay is observed in the output of the flip-flops 11 to 16, as shown in solid line in FIG. 3. However, in practical devices, some time delay appears in the outputs due to stray capacitances of transistors and wiring, as shown by dotted lines in FIG. 3. The delays in output in the first few stages are very small and cause no problem. The output time delays cumulate, however, and in the later stages become significant with respect to counter operation; that is, since the time delay of the final output $Q_{16}$ becomes greater as the number of the stages cascaded is increased, the output timing and the reset timing are also delayed. For example, if the time delay of the final output becomes longer than the clock repetition period, the counter is no longer reset. The same drawback occurs in the case where the clock repetition period is made short to operate the counter in a high-frequency range. These delays also are a problem with respect to synchronization of the counter output with related circuit elements.

SUMMARY OF THE INVENTION

It is a primary object of the present invention to provide a counter enabling a counting operation free from the output time delays of the component stages.

It is another object of the present invention to provide a counter having excellent high-frequency operation.

The counter according to the present invention includes a first section having a plurality of cascaded flip-flops for counting an input signal, a second section having a plurality of cascaded flip-flops for counting the output of the first section, a first detector for detecting a predetermined state of the first section, a second detector for detecting a predetermined state of the second section, and a third detector responsive to detection of outputs from the first and second detectors for producing a third output. As discussed in more detail hereinafter, this is accomplished by applying the inverted output of the final stage flip-flop in the first section as the input to the second section.

The counter according to this invention produces an output and resets the flip-flops in the first and second sections in response to the simultaneous detection of the first and second detectors. In particular, the timing of the output and the reset is predominantly determined by the output timing of the first detector. Here, since the time delay of the output timing from this first detector is relatively small, the problems caused by delay are minimized. That is, the output timing and the reset timing are not affected by the time delay of the output from the second detector. This results in accurate output timing and ensures reset of the flip-flops. Even if a high-frequency clock signal is employed as the input signal, the same results can be attained in the counter of this invention. Thus, the counter of this invention has excellent high-frequency characteristics.

BRIEF DESCRIPTION OF THE DRAWINGS

The above and other objects and features of the invention will become more apparent from the following description taken in conjunction with the accompanying drawings, wherein:

FIG. 1 is a block diagram showing in block form a counter of the prior art;

FIG. 2 is a circuit diagram showing an example of a counter of the prior art;

FIG. 3 is a waveform diagram showing signals at various points of the counter shown in FIG. 2;

DESCRIPTION OF THE PREFERRED EMBODIMENTS

Figure 4:
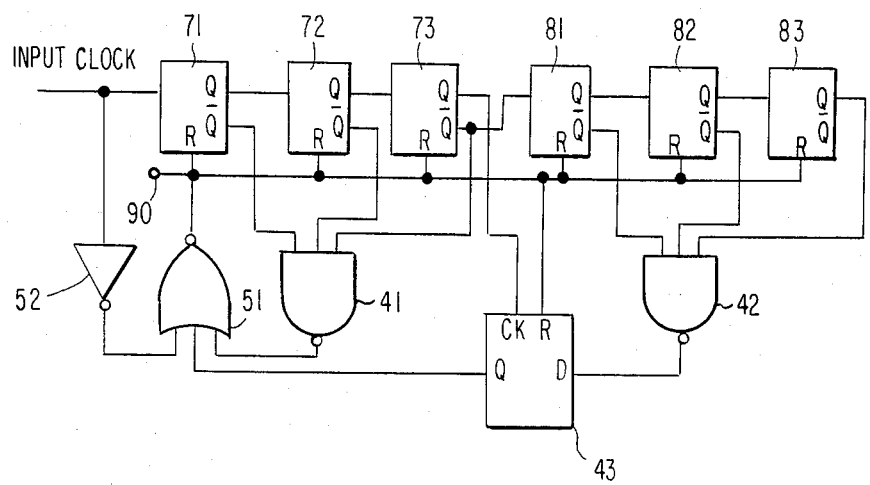
FIG. 4 is a circuit diagram showing a first embodiment of the present invention.

According to a first embodiment shown in FIG. 4, six flip-flops are divided into a first section of three cascaded flip-flops 71, 72 and 73 and a second section including three cascaded flip-flops 81, 82 and 83. Except for the fact that an inverted output $\bar{Q}$ of the last flip-flop 73 in the first section is applied to the first flip-flop 81 in the second section, the output Q of every flip-flop is applied to the next flip-flop. The desired outputs of flip-flops 71, 72 and 73 in the first section are applied to respective inputs of a NAND gate 41 depending upon the less significant digits in the number to be counted. Similarly, the desired outputs of flip-flops 81, 82 and 83 in the second stage are applied to respective inputs of a NAND gate 42 depending upon the more significant digits in the number to be counted. The output signal from the NAND circuit 42 is applied to a flip-flop 43 so as to be once latched. The output signal Q of the flip-flop 73 is applied to a clock terminal CK of the flip-flop 43. An output Q of this flip-flop 43 and an output of the NAND gate 41 are applied to a NOR gate 51 together with the output of inverter 52. The inverter 52 is used for inverting the input clock signal and applying it to the NOR gate 51 to synchronize the output from the NOR gate 51 with the input clock signal. The output from the NOR gate 51 is applied to reset terminals R of all the flip-flops 43, 71, 72, 73, 81 82 and 83 to reset them to their initial states. A counter output is derived at the output terminal 90 from the output of the NOR gate 51.

The operation of the illustrated first embodiment will be explained with reference to the waveforms shown in FIG. 5. The respective flip-flops 71–73 and 81–83 have their outputs inverted in response to the count action of the input clock signal and produce output signals $Q_{71}$, $Q_{72}$, $Q_{73}$, $Q_{81}$, $Q_{82}$ and $Q_{83}$, respectively. At such time, the time delays of the respective output signals are as shown by dotted lines of waveform $Q_{83}$. As previously discussed, the time delay becomes most significant at the last flip-flop 83. In this embodiment it can be seen that comparing the output signals $Q_{14}$, $Q_{15}$ and $Q_{16}$ shown in FIG. 3 with the output signals $Q_{81}$, $Q_{82}$ and $Q_{83}$ of the flip-flops 81, 82 and 83, the output signals $Q_{81}$, $Q_{82}$ and $Q_{83}$ are advanced by one-half cycle of the output signal $Q_{73}$ (corresponding to the output signal $Q_{13}$) with respect to the output signals $Q_{14}$, $Q_{15}$ and $Q_{16}$. Therefore, while the NAND gate 41 in the first section generates an output signal upon every "8" count of the input clock signal, the NAND gate 42 in the second section produces an output signal before each "37" count of the input clock signal, that is, after the input clock signal has counted up to "28".

The output of the NAND gate 42 is once latched in the flip-flop 43 as synchronized with the output Q of the flip-flop 73. Since the output Q of this flip-flop 43 and the output of NAND circuit 41 are applied to the NOR gate 51 together with the input clock signal inverted by the inverter 52, all the flip-flops 71–73, 81–83 and 43 are reset as synchronized with the input clock signal. The output of the NOR gate 51 is also derived from the output terminal 90 as the counter output. Thereafter, the counter recommences the same counting action.

Figure 5:
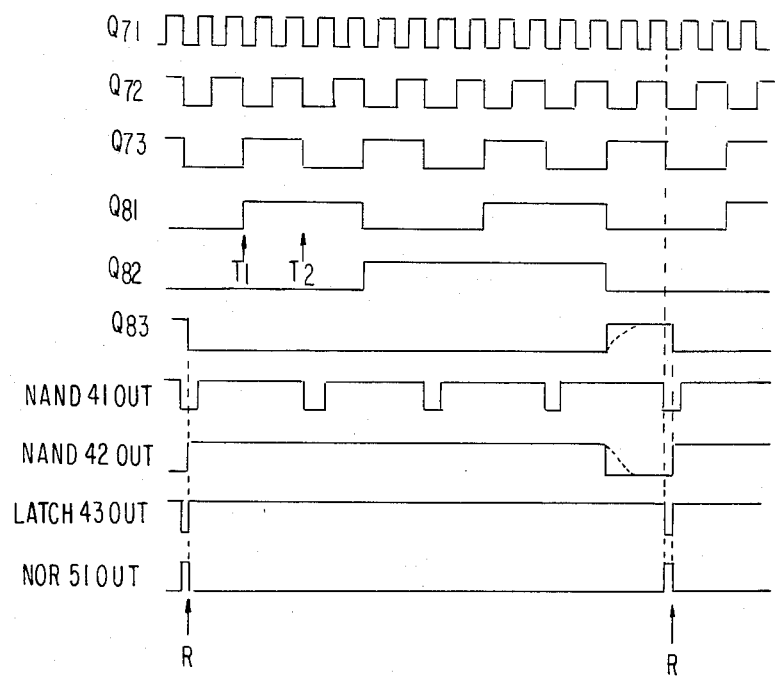
FIG. 5 is a waveform diagram showing signals at various points of the first embodiment shown in FIG. 4.

In FIG. 5 an arrow R indicates the time point when the reset is effected, similarly to FIG. 3. Further, the counter output may be derived by receiving the output of the NOR gate 51 by, for example, a flip-flop.

As described above, since the second section has been preliminarily brought into a detected state prior to counting or detection of the predetermined number, the counter is reset in response to the count detection in the first section which has a relatively small time delay. Consequently, the counter produces a timely counter output and achieves certain reset even if a high-frequency signal is received as an input clock signal. Thus, the counter has an excellent high-frequency operation.

It is noted that provision must be made such that, when an output signal appears from NAND gate 42 in the second section, an output should be produced only once from the NAND gate 41 in the first section. If the first section is formed of three consecutive flip-flops, the second section should be designed to produce an output signal after counting the predetermined number minus "8". This means that the time delay of the output from the second stage can be, at maximum, that corresponding to "8" input clock cycles. In other words, if the preceding stage is formed of of least two flip-flops, preferably three or more flip-flops, in most cases the problem due to the time delay of the output from the second section can be eliminated.

Some modifications may be applied to the abovementioned embodiment. For example, instead of applying the inverted output Q of the flip-flop 73 to the flip-flop 81, the output Q of the flip-flop 73 may be applied to the flip-flop 81 through an inverter. The flip-flop 43 inserted for latching the output from the NAND gate 42 may be omitted. Especially, when the detection is made in a second or fourth quarter-period of the output from the flip-flop 81, it is not necessary to latch the output of the NAND gate 42. Further, the inverter 52 may be also omitted so that the NOR gate 51 may receive only the output of the NAND gate 41 and the output from the flip-flop 43 or the NAND gate 42. Still further, when the output from the output terminal 90 is obtained every $2^n$ input clock signals, the counter requires no reset operation, and the reset circuit may be omitted.

Figure 6:
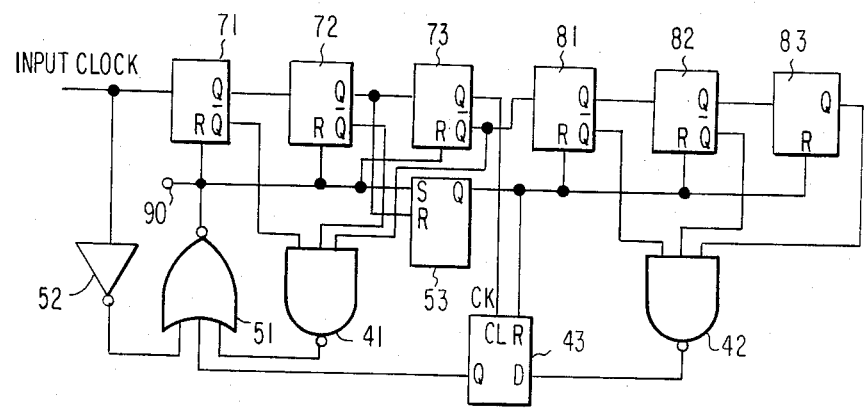
FIG. 6 is a circuit diagram showing a second embodiment of the present invention.

According to a second embodiment shown in FIG. 6, a flip-flop 53 is added to the first embodiment shown in FIG. 4. The flip-flop 53 is set by the output from the NOR gate 51 and resets the flip-flops 43, 81, 82 and 83 by its output Q. It is reset by the output Q of the flip-flop 72. The other elements are similarly connected as in the abovementioned first embodiment and the same reference numerals are given to the same parts.

Figure 7:
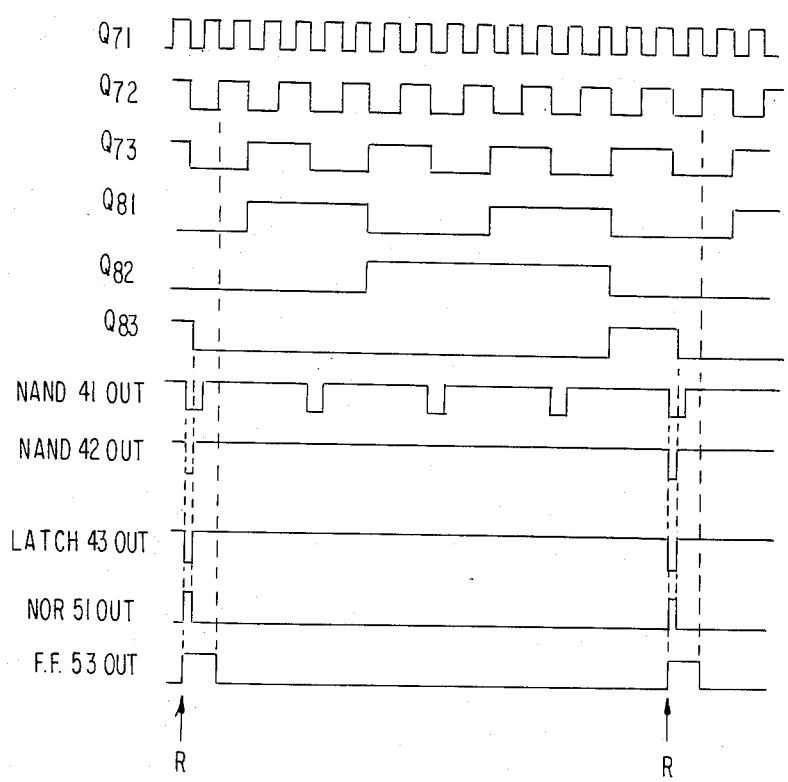
FIG. 7 is a waveform diagram showing signals at various points of the second embodiment shown in FIG. 6.

Referring to FIG. 7 showing the output waveforms at various points of the second embodiment, all the outputs except for the output from the flip-flop 53 are similar to those of FIG. 5. Since flip-flop 53 is reset by the second flip-flop 72, the output therefrom continues for four input clock periods after the number to be counted is detected by the NOR gate 51. The flip-flops 81, 82 and 83 in the second section are reset by this long period pulse. If these flip-flops 81, 82 and 83 are reset by a short-period pulse, the output time delay of these flip-flops causes an uncertainty of their reset. However, since in this embodiment these flip-flops 81, 82 and 83 are reset by a long pulse, possible reset is certain. While the output signals $Q_{81}$, $Q_{82}$ and $Q_{83}$ in FIG. 7 are shown to be the same as those in FIG. 5, it is noted that they may be different from those in FIG. 5 according to the number to be counted. Further, it is apparent to those skilled in the art that the flip-flop 53 may be reset by the output from any one of the flip-flops in the first section. The flip-flop whose output resets the flip-flop 53 should be selected by the output time delay of the final flip-flop 83 in the second section.

The counter according to the present invention is especially effective for dividing a high-frequency basic signal in electronic watches, electronic musical instruments, and so on. For instance, for dividing a basic signal of 2 MHz into 4–8 KHz, a large number of cascaded flip-flops are required. In such instance, if the basic signal is divided according to the present invention, a predetermined frequency dividing operation can be assured without taking the delay in the flip-flop outputs into consideration; thus, the circuit design becomes easier.

While the invention has been described in detail and with reference to specific embodiments thereof, it will be apparent to one skilled in the art that various changes and modifications can be made therein without departing from the spirit and scope thereof.

I claim:

1. A counter comprising
   a first counter section including a plurality of cascaded flip-flops, said first counter section receiving and counting an input signal and producing a first output signal, said first counter section further including means for generating a second output signal having the same repetition frequency as said first output signal but having a phase opposite to said first output signal;
   a second counter section including a plurality of cascaded flip-flops, said second counter section receiving and counting said second output signal from said first counter section;
   a first detector producing a first partial output in response to a predetermined set of states of the flip-flops in said first counter section;
   a second detector producing a second partial output in response to a predetermined set of states of the flip-flops in said second counter section; and
   a third detector producing a count output in response to the concurrent existence of said first and second partial outputs.

2. A counter as claimed in claim 1, wherein the number of said cascaded flip-flops in said first counter section is three.

3. A counter as claimed in claim 1 or 2, further comprising a latch circuit inserted between said second and third detectors.

4. A counter as claimed in claim 1 or 2, wherein the last stage flip-flop in said first counter section has one output end generating said first output signal and another output end generating said second output signal.

5. A counter as claimed in claim 1 or 2, wherein said means is an inverter inverting the phase of said first output signal to produce said second output signal.

6. A counter as claimed in claim 1, wherein said flip-flops in said first and second counter sections are reset to their initial state by said count output.

7. A counter comprising a first partial counter counting an input signal to produce a first signal and a second signal different in phase from said first signal, a second partial counter counting said second signal, a first detector producing a third signal in response to a predetermined counting state of said first partial counter, a second detector producing a fourth signal in response to a predetermined counting state of said second partial counter, and a third detector producing a count output in response to the concurrent existence of said third and fourth signals, wherein said fourth signal is produced before said count output is produced by an amount related to the phase difference between said first and second signals.

8. A counter as claimed in claim 7, wherein each of said first and second partial counters comprises a plurality of cascaded flip-flops.

9. A counter as claimed in claim 8, wherein said flip-flops each have a first output end and a second output end, said first and second output ends producing signals different in phase.

10. A counter as claimed in claim 9, wherein the signals produced from said first output end of each flip-flop except for the last flip-flop in said first and second partial counters are respectively applied to each succeeding flip-flop.

11. A counter as claimed in claim 10, wherein the signal produced from said second output end of said last flip-flop in said first partial counter is applied to the first flip-flop in said second partial counter.

12. A counter as claimed in claim 8, wherein said flip-flops are reset to their initial states by said count output.

13. A counter as claimed in claim 12, wherein said flip-flops in said second partial counter are reset by a signal having a period longer than that of said count output.

14. A counter as claimed in claim 7 or 8, wherein said count output is produced in synchronism with said input signal.

15. A counter as claimed in claim 7 or 8, wherein said fourth signal is initiated prior to the production of said third signal.

16. A counter as claimed in claim 15, wherein the occurrence of said count output is controlled by said third output.

17. A counter comprising
    a receiving means for receiving an input signal having a frequency,
    a first dividing means having a plurality of cascaded flip-flops for dividing said frequency of said input signal into low frequency and for outputting a signal with said low frequency,
    a second dividing means having a plurality of cascaded flip-flops,
    means for transferring an inverted signal of said signal with said low frequency to said second dividing means,
    means for deriving an output signal with a frequency divided by said second dividing means, and
    means for resetting said first and second dividing means to their initial states, said resetting means using said output signal to reset said first and second dividing means before the termination of said output signal.

* * * * *

UNITED STATES PATENT AND TRADEMARK OFFICE
CERTIFICATE OF CORRECTION

PATENT NO. : 4,493,095

DATED : January 8, 1985

INVENTOR(S) : Akira YAZAWA

It is certified that error appears in the above-identified patent and that said Letters Patent is hereby corrected as shown below:

Column 3, line 52, delete "37" and insert therefor --32--.

Column 4, line 20, delete "of" (second occurrence).

Signed and Sealed this

Ninth Day of July 1985

[SEAL]

Attest:

DONALD J. QUIGG

Attesting Officer     Acting Commissioner of Patents and Trademarks